United States Patent [19]

Parker et al.

[11] 4,101,813
[45] Jul. 18, 1978

[54] DOUBLE DEFLECTION SYSTEM FOR AN ELECTRON BEAM DEVICE

[75] Inventors: Norman W. Parker; Steven D. Golladay, both of Chicago; Albert V. Crewe, Palos Park, all of Ill.

[73] Assignee: The United States of America as represented by the United States Department of Energy, Washington, D.C.

[21] Appl. No.: 787,416

[22] Filed: Apr. 14, 1977

[51] Int. Cl.² ............................................. H01J 29/56
[52] U.S. Cl. .................................. 315/370; 250/396 R
[58] Field of Search ................ 315/370, 371; 250/311, 250/396 R

[56] References Cited

U.S. PATENT DOCUMENTS

| 3,753,034 | 8/1973 | Spicer | 250/396 |
| 3,911,321 | 10/1975 | Wardly | 315/370 |

Primary Examiner—Maynard R. Wilbur
Assistant Examiner—T. M. Blum
Attorney, Agent, or Firm—Dean E. Carlson; Arthur A. Churm; Paul A. Gottlieb

[57] ABSTRACT

A double deflection scanning system for electron beam instruments is provided embodying a means of correcting isotropic coma, and anisotropic coma aberrations induced by the magnetic lens of such an instrument. The scanning system deflects the beam prior to entry into the magnetic lens from the normal on-axis intersection of the beam with the lens according to predetermined formulas and thereby reduces the aberrations.

7 Claims, 6 Drawing Figures

… …

DOUBLE DEFLECTION SYSTEM FOR AN ELECTRON BEAM DEVICE

CONTRACTUAL ORIGIN OF THE INVENTION

The invention described herein was made in the course of, or under, a contract with the UNITED STATES ENERGY RESEARCH AND DEVELOPMENT ADMINISTRATION.

BACKGROUND OF THE INVENTION

The resolution and field of view obtainable in electron beam instruments such as scanning electron microscopes, electron beam microprobes, electron beam lithographic machines and oscilloscopes is limited by third order aberrations of the optical system. An electron beam instrument is one which produces an electron beam directed along an axis, has a focusing lens and means for scanning the focused beam. These aberrations are of eight types: isotropic and anisotropic distortion, curvature of field, isotropic and anisotropic astigmatism, isotropic and anisotropic coma, and spherical aberration. For an image point on the optical axis of the system, only spherical aberration occurs. As the electron beam is focused onto image points farther off axis, the remaining seven aberrations become significant in determining the attainable focused spot size and the degree of distortion present in the image.

Several of these optical aberrations are easily corrected with commonly known techniques. The only aberrations which limit field of view for which some sort of simultaneous correction has not been provided are isotropic and anisotropic coma. As is commonly known, proper placement of the beam defining aperture enables isotropic coma to be cancelled, even in nonscanning electron beam instruments such as the conventional electron microscope. There has been, however, no means of completely correcting the anisotropic coma aberration. Further, the simultaneous correction of anisotropic and isotropic while minimizing curvature of field has not been provided.

It is therefore an object of this invention to provide an electron beam system having simultaneous correction of both isotropic and anisotropic coma.

Another object of this invention is to provide a double delfection scanning system for an electron beam instrument which provides simultaneous correction of isotropic and anisotropic coma.

SUMMARY OF THE INVENTION

In an electron beam instrument in which an electron beam is developed and then focused by a magnetic lens to a particular spot, there is provided means for simultaneously eliminating anisotropic and isotropic coma, aberration caused by the magnetic lens while minimizing curvature of field. A double deflection scanning system is provided which is positioned prior to entry of the beam into the magnetic lens. The system is intended to deflect the beam so that its intersection with the aperture plane of the magnetic lens is displaced from the normal entry point of the beam into such lens by an amount predetermined by formulas. The slope of entry into the lens remains unchanged. A particular circuit is provided for controlling the double deflection scheme so that the desired displacement may be implemented.

DETAILED DESCRIPTION OF THE PREFERRED EMBODIMENT

Figure 1:
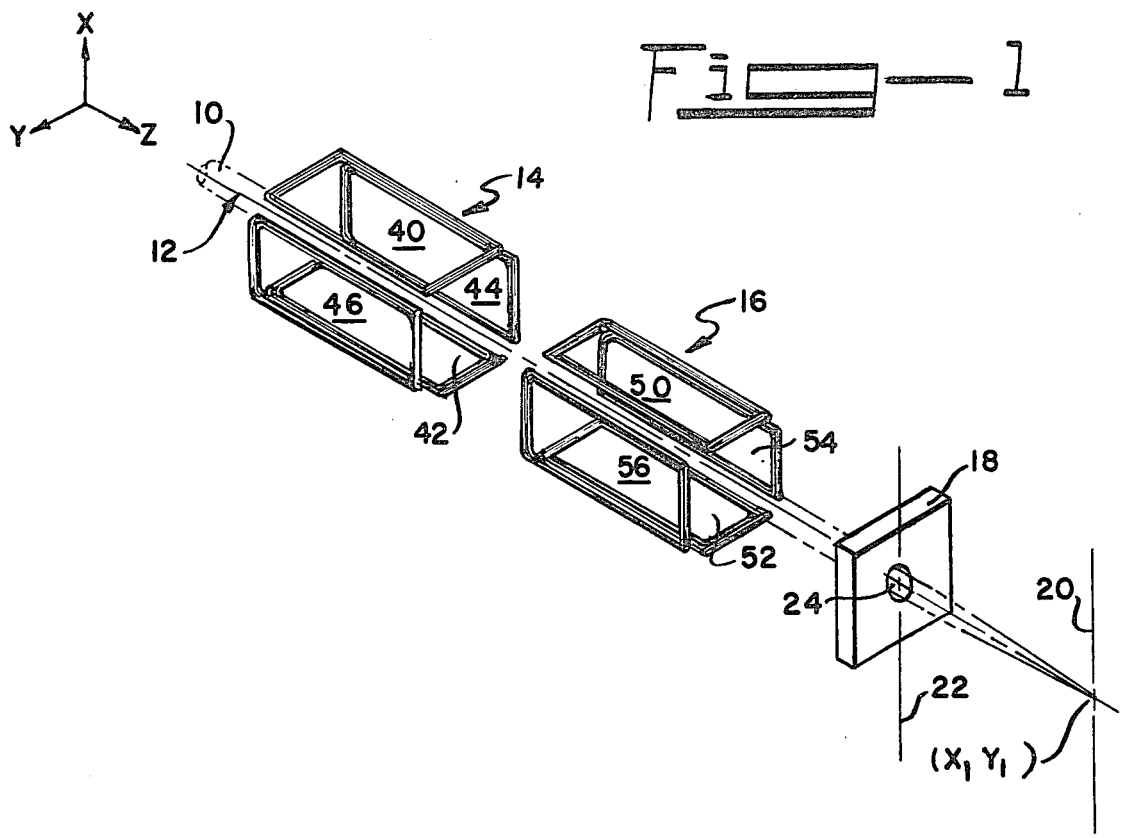
FIG. 1 is a view of an electron beam instrument.

Referring to FIG. 1 there is shown a three-dimensional view of an electron beam instrument utilizing a double deflection scanning system. An electron beam 10 is generated by the instrument by means not shown and is generally directed along an axis 12. Axis 12 is called the optical axis. The beam first enters a double deflection scanning system comprised of delfecting elements 14 and 16. The beam then enters a magnetic lens 18. Magnetic lens 18 focuses the beam to a small spot in plane 20, the image plane. This spot is called the image point and has coordinates generally denominated by $x_1$ and $y_1$. The double deflection scanning system comprised of elements 14 and 16 is designed to deflect the beam from its path along axis 12. In prior art devices, double deflection systems deflect the beam in order to develop a raster scan. The deflected beam intersected the aperture plane 22 of lens 18 where plane 22 intersects axis 12 at point 24 at a variety of slopes. The slope determined the ultimate position of the image point. Such an electron beam system suffered from uncorrected isotropic and anisotropic coma.

Figure 2:
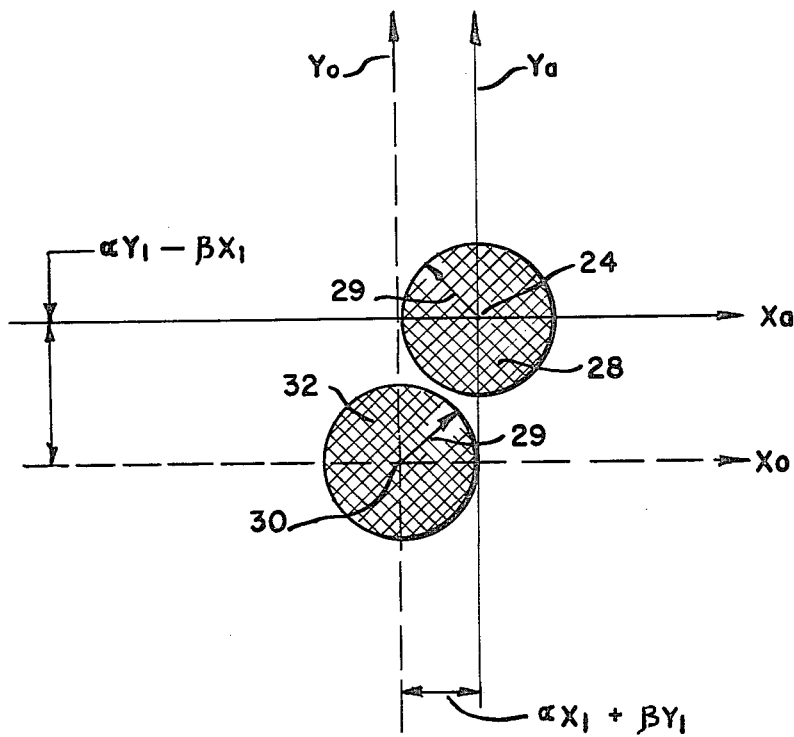
FIG. 2 is a plot showing the normal and displaced intersection of an electron beam with the aperture plane.

Referring to FIG. 2, there is shown an $x$-$y$ cross sectional view of the electron optical system of FIG. 1 at the aperture plane 22. Axes $x_a$ and $y_a$ intersect at point 24 which is also the intersection of aperture plane 22 with the optical axis 12. In prior art devices the electron beam cross section in the aperture plane 22 would always be centered at point 24. The intersection of the electron beam with plane 22 is represented by the electron beam cross section 28 centered at point 24. Of course, the slope of this intersection will vary as introduced by some deflection means so that a raster scan can be obtained in the image plane.

It is commonly known that the image aberrations of an electron beam passing through an electron optical system may be written as functions of the intercepts of the electron beam with any two distinct planes. These two planes are often called the image plane 20 and the aperture plane 22. The coordinates of the beam intercepts in these two planes are taken as $(x_1, y_1)$ and $(x_a, y_a)$, respectively. Each of the eight electron optical aberrations is characterized by an aberration coefficient, whose value is calculable by well known methods for each particular instrument. These aberration coefficients are commonly referred to as:

$S_1$ = isotropic distortion
$S_2$ = anisotropic distortion
$S_3$ = curvature of field
$S_4$ = isotropic astigmatism
$S_5$ = anisotropic astigmatism
$S_6$ = isotropic coma
$S_7$ = anisotropic coma
$S_8$ = spherical aberration The equations for the optical aberrations in the image plane 20 are:

$$\delta x_1 = -\{S_1 x_1(x_1^2+y_1^2) - S_2 y_1(x_1^2+y_1^2) \\ + S_3 x_a(x_1^2+y_1^2) + S_4[x_a(x_1^2-y_1^2)+2y_a x_1 y_1]$$

$$+S_5[y_a(x_1^2-y_1^2)-2x_ax_1y_1]$$
$$+S_6[x_1(3x_a^2+y_a^2)+2y_1x_ay_a]$$
$$+S_7[-y_1(3x_a^2+y_a^2)+2x_1x_ay_a]+S_8x_a(x_a^2+y_a^2)\} \quad \text{(eq. 1a)}$$

$$\delta y_1 = -\{S_1y_1(x_1^2+y_1^2)+S_2x_1(x_1^2+y_1^2)$$
$$+S_3y_a(x_1^2+y_1^2)+S_4[-y_a(x_1^2-y_1^2)+2x_ax_1y_1]$$
$$+S_5[x_a(x_1^2-y_1^2)+2y_ax_1y_1]$$
$$+S_6[y_1(3y_a^2+x_a^2)+2x_1x_ay_a]$$
$$+S_7[x_1(3y_a^2+x_a^2)-2y_1x_ay_a]+S_8y_a(x_a^2+y_a^2)\} \quad \text{(eq. 1b)}$$

Equations 1a and 1b are written in terms of $(x_a, y_a)$ and $(x_1, y_1)$ where the coordinates $x_a$ and $y_a$ are defined in terms of the axes $x_a$ and $y_a$ centered on point 24. If the beam is also centered on point 24, we may express the points within the beam cross section 28 using the equation:

$$x_a^2 + y_a^2 \leq \nu^2 \quad \text{(eq. 2)}$$

where $\nu$ is the radius 29 of the beam cross-section 28. If the beam is centered on another point in the plane 22, for example point 30, it is possible to express the optical aberrations in the image plane in terms of a different coordinate system comprising axes $x_o$ and $y_o$ intersecting at point 30. Then the points within the beam cross-section 32 may be expressed by the equation:

$$x_o^2 + y_o^2 \leq \nu^2 \quad \text{(eq. 3)}$$

The relation between the coordinate systems $(x_a, y_a)$ and $(x_o, y_o)$ may be expressed in terms of the distance between the origins of the two coordinate systems, points 24 and 30, respectively:

$$x_a = x_o + \alpha\, x_1 + \beta\, y_1 \quad \text{(eq. 4)}$$
$$y_a = y_o + \alpha\, y_1 - \beta\, x_1$$

Now, using equation 4, the image plane aberrations given by equation 1 may be expressed in terms of $(x_o, y_o)$ instead of $(x_a, y_a)$:

$$\delta X_1 = -\{S_1^* x_1(x_1^2+y_1^2) - S_2^* y_1(x_1^2+y_1^2)$$
$$+S_3^* x_o(x_1^2+y_1^2)+S_4^*[x_o(x_1^2-y_1^2)+2y_ox_1y_1]$$
$$+S_5^*[y_o(x_1^2-y_1^2)-2x_ox_1y_1]$$
$$+S_6^*[x_1(3x_o^2+y_o^2)+2y_1x_oy_o]$$
$$+S_7^*[-y_1(3x_o^2+y_o^2)+2x_1x_oy_o]+S_8^* x_o(x_o^2+y_o^2)\} \quad \text{(eq. 5a)}$$

$$\delta y_1 = -\{S_1^* y_1(x_1^2+y_1^2)+S_2^* x_1(x_1^2+y_1^2)$$
$$+S_3^* y_o(x_1^2+y_1^2)+S_4^*[-y_o(x_1^2-y_1^2)+2x_ox_1y_1]$$
$$+S_5^*[x_o(x_1^2-y_1^2)+2y_ox_1y_1]$$
$$+S_6^*[y_1(3y_o^2+x_o^2)+2x_1x_oy_o]$$
$$+S_7^*[x_1(3y_o^2+x_o^2)-2y_1x_oy_o]+S_8^* y_o(x_o^2+y_o^2)\} \quad \text{(eq. 5b)}$$

Where a new set of aberration coefficients must be used:

$$S_1^* = S_1 + \alpha(S_3+S_4) - \beta S_5 + (3\alpha^2+\beta^2)S_6$$
$$\quad -2\alpha\beta S_7 + \alpha(\alpha^2+\beta^2)S_8$$
$$S_2^* = S_2 - \beta(S_3-S_4) + \alpha S_5 - 2\alpha\beta S_6 + (\alpha^2+3\beta^2)S_7$$
$$\quad -\beta(\alpha^2+\beta^2)S_8$$
$$S_3^* = S_3 + 4\alpha S_6 - 4\beta S_7 + 2(\alpha^2+\beta^2)S_8$$
$$S_4^* = S_4 + 2\alpha S_6 + 2\beta S_7 + (\alpha^2-\beta^2)S_8 \quad \text{(eq. 6)}$$
$$S_5^* = S_5 - 2\beta S_6 + 2\alpha S_7 - 2\alpha\beta S_8$$
$$S_6^* = S_6 + \alpha S_8$$
$$S_7^* = S_7 - \beta S_8$$
$$S_8^* = S_8$$

Equation 6 shows that if $\alpha$ and $\beta$ are given the values:

$$\alpha = -(S_6/S_8) \quad \beta = (S_7/S_8) \quad \text{(eq. 7)}$$

then $$S_6^* = S_7^* = 0 \quad \text{(eq. 8)}$$

and both the isotropic and anisotropic coma terms in the aberration eqs. 5a and 5b are cancelled. With the $\alpha$ and $\beta$ values given in eq. 7, the remaining six aberration coefficients take on these values:

$$S_1^* = S_1 - \frac{S_3 S_6 + S_4 S_6 + S_5 S_7}{S_8} + 2\frac{(S_6^2+S_7^2)S_6}{S_8^2} \quad \text{(eq. 9)}$$

$$S_2^* = S_2 - \frac{S_3 S_7 - S_4 S_7 + S_5 S_6}{S_8} + 2\frac{(S_6^2+S_7^2)S_7}{S_8^2}$$

$$S_3^* = S_3 - 2\frac{S_6^2+S_7^2}{S_8}$$

$$S_4^* = S_4 - \frac{S_6^2 - S_7^2}{S_8}$$

$$S_5^* = S_5 - 2\frac{S_6 S_7}{S_8}$$

$$S_8^* = S_8$$

Next, the equation for $S_3^*$ from equation 6 can be differentiated with respect to $\alpha$ and $\beta$:

$$\frac{dS_3^*}{d\alpha} = 4S_6 + 4\alpha S_8 = 4S_6^* \quad \text{(eq. 10)}$$

$$\frac{dS_3^*}{d\beta} = -4S_7 + 4\beta S_8 = -4S_7^*$$

From this it can be seen that when the $\alpha$ and $\beta$ values from equation 7 are used to obtain the $S_6$ and $S_7$ values in equation 8, the $\alpha$ and $\beta$ derivatives of $S_3$ satisfy:

$$\frac{dS_3^*}{d\alpha} = \frac{dS_3^*}{d\beta} = 0 \quad \text{(eq. 11)}$$

Since $S_3^*$ is a quadratic function in $\alpha$ and $\beta$, a zero derivative is the standard condition for a minimum or maximum with respect to variations in $\alpha$ and $\beta$. Numerous calculations of the eight aberration coefficients have shown that the conditions in eq. 11 signify a minimization of the magnitude of $S_3^*$, and thus the $\alpha$ and $\beta$ values in equation 7 correct both coma aberrations and also simultaneously minimize the curvature of field aberration.

Figure 3:
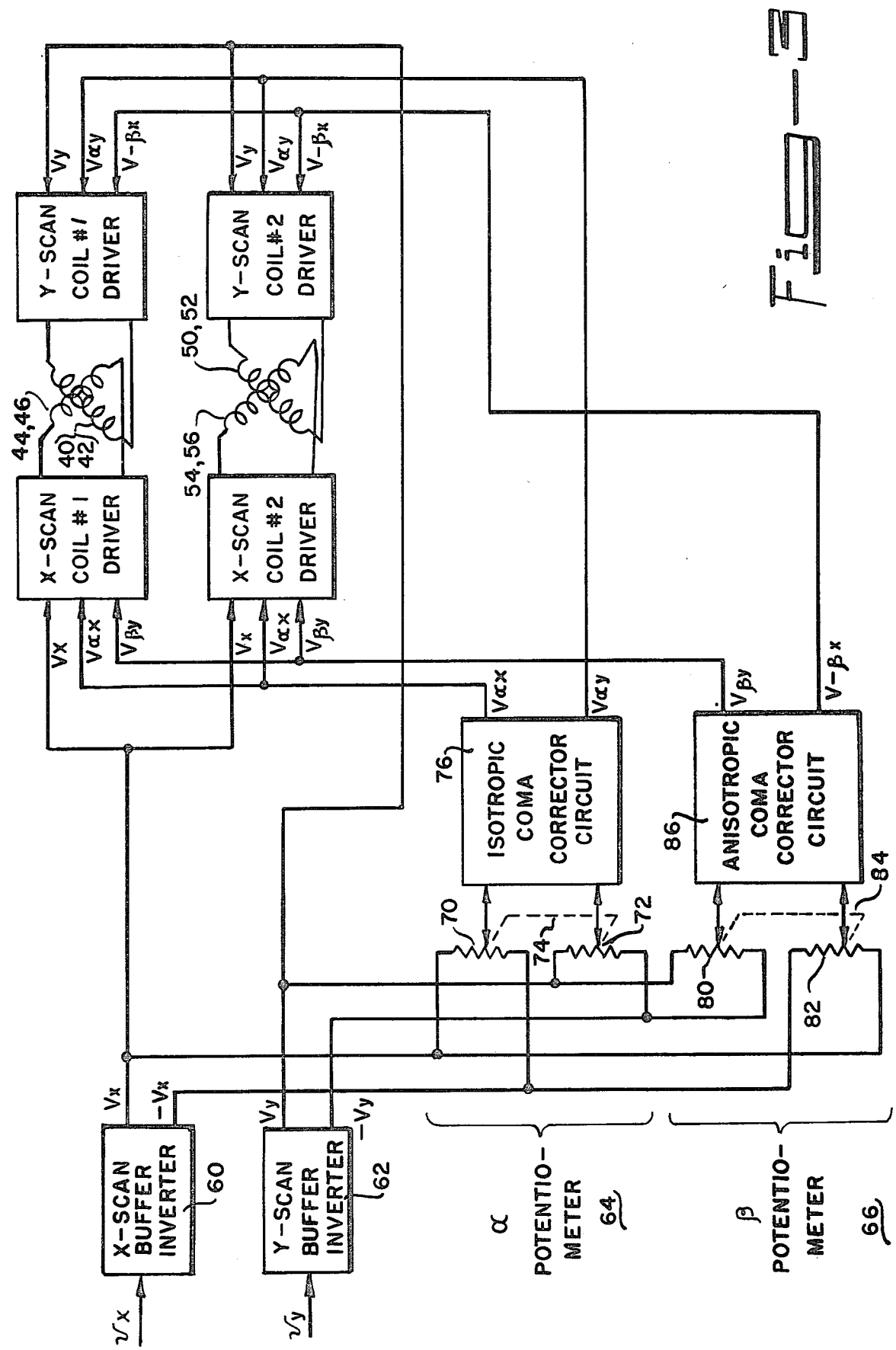
FIG. 3 is a block diagram of the circuitry for providing for correction anisotropic and isotropic coma.

Means are provided, as shown in FIG. 3, to regulate the deflection system of FIG. 2 so that the intersection of the electron beam with the aberration plane 22 is governed by the principles just described. Referring to FIG. 1 the double deflection system is comprised of deflection elements 14 and 16. Opposite pairs of coils such as coils 40 and 42 contain equal numbers of turns and are wired in series so as to conduct the same amount of current. The polarities of the windings are such that a magnetic field is induced. Element 14 is comprised of coils 40, 42, 44, and 46. Coils 40 and 42 induce a magnetic field parallel to the $x$ axis which deflects the electron beam 10 parallel to the $y$ axis. Coils 44 and 46 induce a magnetic field parallel to the $y$ axis, which deflects the electron beam 10 parallel to the $x$ axis. Deflection element 16 is comprised of coils 50, 52, 54 and 56 which are similarly coupled as the coils of element 14. Coils 50 and 52 produce a magnetic field parallel to the $x$ axis and coils 54 and 56 produce a magnetic field parallel to the $y$ axis. The effect of these two fields are identical to those of the similar fields produced by the coils of deflection element 14.

Referring to FIG. 3, there is shown a block diagram of circuitry for controlling the deflection introduced by the coils of elements 14 and 16 so that the beam intercepts the aperture plane 22 at the desired point with the desired slope. An electron beam instrument having a double deflection system for providing raster scan normally utilizes control voltages $v_x$ and $v_y$ for controlling the raster scan. These are generally ramps to make the raster scan. $v_x$ controls the $x$ coordinate and $v_y$ controls the $y$ coordinate of the intercept of the focused spot with image plane 20. These normally would be applied to the coils of element 14 and to the coils of element 16. This double deflection is what introduces the slope into the intersection of the beam with the aperture plane 22 at the optical axis 12. While voltage $v_x$ is a linear function of the desired image point with $v_x = 0$ corresponding to $x_1 = 0$ and similarly voltage $v_y$ is a linear function of desired image point with $v_y = 0$ corresponding to $y_1 = 0$. Voltage $v_x$ is applied to x scan buffer/inverter 60 which generates output voltages $V_x$ and $-V_x$ proportional to $v_x$, but isolated from $v_x$. Similarly, voltage $v_y$ is applied to y scan buffer/inverter 62 which generates output voltages $V_y$ and $-V_y$ proportional to $v_y$, but isolated from $v_y$. The inverters are adjusted so that $[V_x] = [-V_x]$ and $[V_y] = [-V_y]$. These outputs are all applied to an $\alpha$ potentiometer 64 and a $\beta$ potentiometer 66 which develop the correction signals for the scanning coils of elements 14 and 16.

$\alpha$ potentiometer 64 is double ganged such that the taps on potentiometers 70 and 72 move in synchrony, controlled by interconnection 74. Voltage $V_x$ is coupled to one terminal of potentiometer 70 and voltage $-V_x$ is coupled to the other terminal of potentiometer 70. Likewise, voltage $V_y$ is coupled to one terminal of potentiometer 72 and voltage $-V_y$ is coupled to the other terminal of potentiometer 72. The outputs of potentiometers 70 and 72 are applied as inputs to isotropic coma corrector circuit 76. The isotropic coma corrector circuit 76 is designed to isolate the output voltages $V_{\alpha x}$ and $V_{\alpha y}$ of circuit 76 from the potentiometers and to provide for controlling the gain of these outputs $V_{\alpha x}$ and $V_{\alpha y}$ are developed by potentiometers 70 and 72 respectively. $\beta$ potentiometer 66 consists of potentiometers 80 and 82 which are double ganged and coupled by interconnection 84 so that their taps move in synchrony. One terminal of potentiometer 80 is coupled to voltage $V_y$ and the other terminal is coupled to voltage $-V_y$. One terminal of potentiometer 82 is coupled to voltage $-V_x$ and the other terminal is coupled to voltage $V_x$. The outputs of potentiometers 80 and 82 are applied to anisotropic coma corrector circuit 86 which functions similarly to the isotropic coma corrector circuit 76 developing output voltages $V_{\beta y}$ and $V_{-\beta x}$. $V_{\beta y}$ and $V_{-\beta x}$ are developed by potentiometers 80 and 82 respectively.

As stated before, each opposing coil of each deflection element 14 and 16 of the double deflection scanning system is coupled in series. The current applied to each pair of series coupled coils is determined by a coil driver. Thus, the $x$ scan coil #1 driver is coupled to coils 44 and 46 of element 14, the $y$ scan coil #1 driver is coupled to coils 40 and 42 of element 14, the $x$ scan coil #2 driver is coupled to coils 54 and 56 of element 16 and the $y$ scan coil #2 driver is coupled to coils 50 and 52 of element 16. The amount of current applied to each pair of coils by the associated driver is determined by three inputs to each driver.

For example, the $x$ scan coil #driver has inputs $V_x$, $V_{\alpha x}$ and $V_{\beta y}$ applied thereto which are combined by the driver to give a voltage $$V_1 = A_1 V_x + A_2 V_{\alpha x} + A_3 V_{\beta y}.$$

The $x$ scan coil #1 driver sends a current through coils 44 and 46 proportional to $V_1$. Similarly $y$ scan coil #1 driver applies a current proportional to $$V_2 = B_1 V_y + B_2 V_{\alpha y} + B_3 V_{-\beta x},$$

$x$ scan coil #2 driver applies a current proportional to $$V_3 = C_1 V_x + C_2 V_{\alpha x} + C_3 V_{\beta y}, \text{ and}$$

$y$ scan coil #2 driver applies a current proportional to $$V_4 = D_1 V_y + D_2 V_{\alpha y} + D_3 V_{-\beta x}.$$

Figure 4:
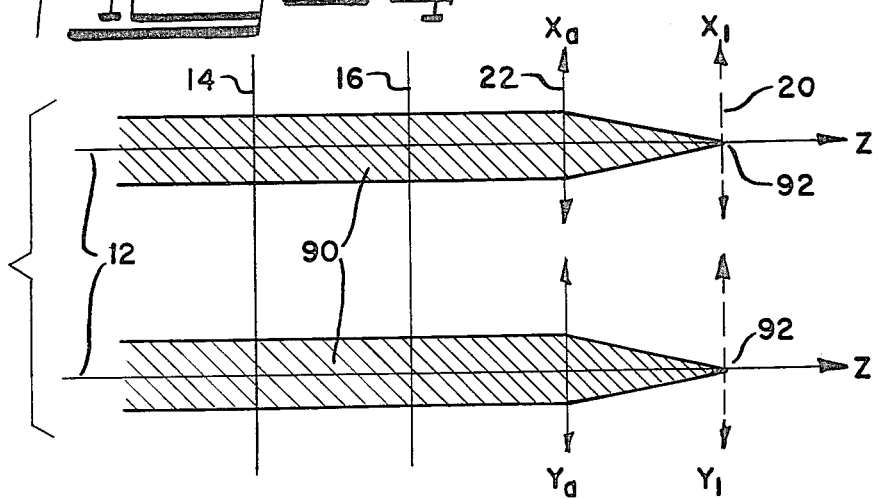
FIG. 4, FIG. 5 and FIG. 6 show representative plots of uncorrected and corrected beam paths.
Figure 5:
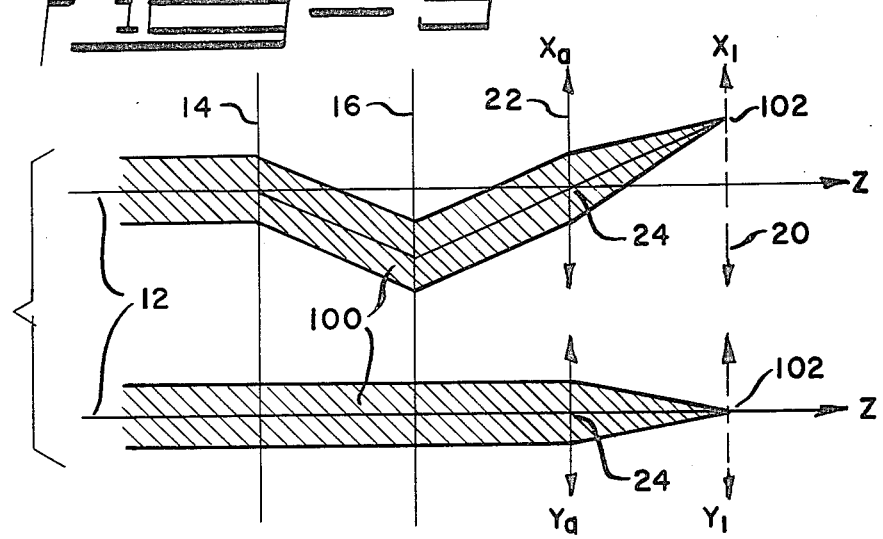
Figure 6:
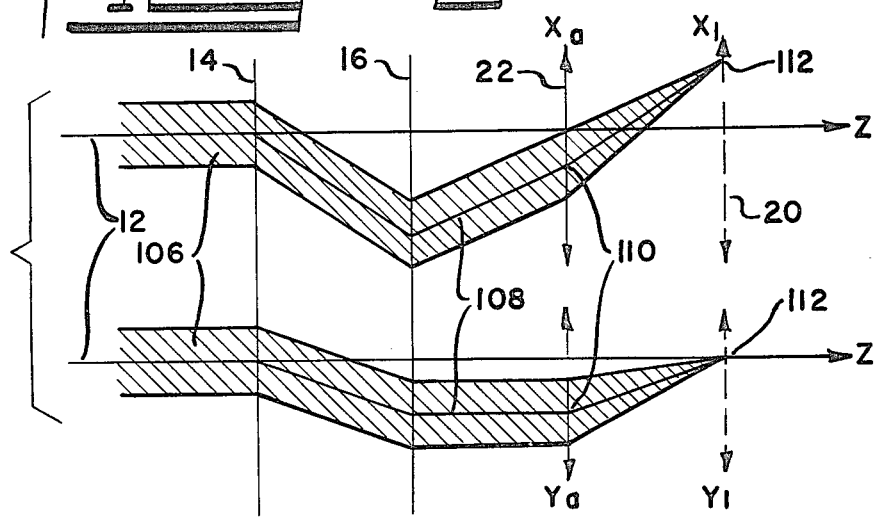

The values of the coefficients are chosen to give the desired scan. $A_1$, $B_1$, $C_1$ and $D_1$ are chosen so that with $\alpha = \beta = 0$, the beam intersects aperture plane 22 at point 24 as shown in FIG. 4 and FIG. 5. All the other coefficients are so chosen so that the beam intercepts aperture plane 22 at the disposed point as shown in FIG. 2 with slope as shown in FIG. 6. The potentiometers 70, 72, 80 and 82 shown in FIG. 3, because they move between plus and minus values of the same voltage, give $\alpha$ and $\beta$ values only between $+1$ and $-1$. The combination of input voltages by each driver with the coefficients allows for a greater range of values of $\alpha$ and $\beta$ and also allows for more precise values such as between $+0.1$ and $-0.1$ as the designer so chooses. Such a combination of weighted voltages is easily accomplished with resistive networks in each driver.

Referring to FIG. 4, there is shown both x-z and y-z side views illustrating schematically the electron beam path through the optical system shown in FIG. 1. In the case shown in FIG. 4, $x_1 = y_1 = 0$, and both deflection elements 14 and 16 are off. Thus, in the x-z view, the beam 90 passes undeflected through $x$ deflection coils 44 and 46 of element 14 and the $x$ deflection coils 54 and 56 of element 16 and is focused by magnetic lens 18 at aperture plane 22 to image point 92 in image plane 20. In the y-z view of FIG. 4, the beam 90 passes undeflected through the y deflection coils 40 and 42 of element 14 and the y delfection coils 50 and 52 of element 16 and is focused by the magnetic lens at aperture plane 20 to image point 92 in image plane 22.

Referring to FIG. 5 and FIG. 6, there is shown the x-z and y-z views of the electron beam corresponding to the case of $x_1 > 0$, $y_1 = 0$. FIGS. 5 and 6 for different settings of the $\alpha$ potentiometer 64 and the $\beta$ potentiometer 66 shown in FIG. 3. Referring to FIG. 5, there is illustrated the beam path 100 for $\alpha$ and $\beta$ potentiometer settings corresponding to $\alpha = \beta = 0$. In this case, the taps on both potentiometers would be centered to give zero voltage into the positive input terminals of circuits 76 and 86. Therefore, the outputs $v_{\alpha x}$, $V_{\alpha y}$, $V_{\beta y}$, and $V_{-\beta x}$ would all be 0 and the device would operate in a manner similar to prior art devices. In the x-z plane, electron beam 100 is deflected in the negative x direction by the x deflection coils 44 and 46 of element 14 and then in the positive direction by x deflection coils 54 and 56 at element 16, so as to pass through the center 24 of the magnetic lens principal plane 22. The beam 100 is then focused by lens 18 to image point 102 in image plane 20. In the y-z plane, the y deflection elements of elements 14 and 16 will be off since the voltage $v_y$ is equal to zero and the beam is undeflected before reaching magnetic lens 24.

Referring to FIG. 6 there is illustrated the beam path 106 for $\alpha$ and $\beta$ potentiometer corresponding to $\alpha$ less than 0 and $\beta$ less than 0. In this case, the taps on the $\alpha$ potentiometers 70 and 72 would be nearer to the terminals at the bottom. The taps on the $\beta$ potentiometers 80 and 82 would be nearer the bottom terminals also. In the x-z plane, electron beam 106 is deflected in the negative x direction by the x deflection coils 44 and 46 of element 14 and then in the positive x direction by the x deflection coils 54 and 56 of element 16. The center 108 of electron beam 106 intersects the magnetic lens principal plane 22 at point 110 with x coordinate, $x = \alpha x_1 + \beta y_1$ where $x_1$, $y_1$ are the coordinates of the image point 112 in plane 20. In the y-z plane, the electron beam 106 is deflected in the $-y$ direction by y deflection coils 40 and 42 of element 14 and then deflected in the $+y$ direction by the y deflection coils 50 and 52 of element 16 so that the electron beam 106 is again parallel to the optical axis 12. The center 108 of electron beam 106 intersects the magnetic lens principal plane at point 110 with y corrdinate $$y = \alpha y_1 - \beta x_1,$$

where $x_1$, $y_1$ are the coordinates of the image point 112 in plane 20. It can be seen from FIG. 6 that the effect of the double deflecting scanning system with the $\alpha$ and $\beta$ potentiometers operating is to deflect the beam so that it intersects the aperture plane 22 at a point displaced from point 24 but with the slope of the intersection with plane 22 unchanged for the uncorrected deflection.

In operation, of course, it will be necessary for the skilled operator to first calibrate the device by adjusting various potentiometers and resistor values as is well known in the operation of a double deflection scanning system to insure that the potentiometers when moved will give equal changes in the displacement as desired. The calibration of $\alpha$ potentiometer 64 and $\beta$ potentiometer 66 can be done by setting appropriate values at 0. Once calibrated the desired value of $\alpha$ is set by adjustment of interconnection 74 and the desired value of $\beta$ is set by adjustment of interconnection 84.

In summary the $\alpha$ and $\beta$ correction is introduced into the double deflection scanning system comprised of elements 14 and 16 by utilizing control voltages $v_x$ and $v_y$. Since $x_1$ and $y_1$ are determined by the control voltages taking a predetermined portion of the control voltages and adding that to the control voltages enables the double deflection system to give a beam intercept with aperture plane 22 which satisifes equation 4. It would be obvious to those skilled in the art that this shceme of correction is equally applicable to electrostatic deflection systems which consist generally of, two opposing plates with equal and opposite voltages applied thereto. Each plate pair is equivalent to the coil pairs shown in FIG. 1. Each driver of FIG. 3 would then be a voltage source instead of a current source.

The embodiments of the invention in which an exclusive property or privelege is claimed are defined as follows:

1. In an electron beam device having means for generating a beam of electrons, a magnetic lens for focusing the beam to a point in any image plane, and scanning means for scanning the focused point in the image plane, the coordinates of the center of the scanned point in the image plane being $(x_1 y_1)$, the beam normally being incident in the aperture plane of the lens at a location whose coordinates of the center of the beam are $(x_o, y_o)$ and at a slope determined by the scanning means, the improvement in the instrument for simultaneously correcting isotropic coma and anisotropic coma aberrations, comprising:

deflection means positioned along the path of the beam prior to entry of the beam into the lens for displacing the intersection of the beam with the aperture plane so that the slope of intersection remains unchanged and so that the coordinates of the center of the beam at intersection ($x_o$ and $y_o$) satisfy the relations $$x_a = x_o + \alpha x_1 + \beta y_1$$

$$y_a = y_o + \alpha y_1 - \beta x_1$$

where $\alpha = S_6/S_8$ and $\beta = S_7/S_8$ wherein $S_6$, $S_7$, and $S_8$, are abberration coefficients.

2. The device of claim 1 wherein said scanning means includes a double deflection system having first and second deflection elements through which the beam passes, each element being capable of deflecting said beam.

3. The device of claim 2 wherein each element includes means for deflecting the beam in the x direction and means for deflecting the beam in the y direction, the amount of deflection in the x direction being controlled by a control voltage $V_x$ and a correction voltage and in the y direction being controlled by a control voltage $V_y$ and another correction voltage, said correction voltages being related to $\alpha$ and $\beta$.

4. The device of claim 3 wherein each deflection element is comprised of two pairs of series coupled opposing coils, with a first pair of said coils of said first element deflecting the beam in the x direction and a second pair of said first element deflecting the beam in the y direction, with a third pair of said coils of said second element deflecting the beam in the $-x$ direction and a fourth pair of said second element deflecting the beam in the $-y$ direction, said second element being between said first element and the lens along the beam path.

5. The device of claim 4 further including a first inverter developing an output equal to $-V_x$, a second inverter developing an output equal to $-V_y$, first and second potentiometers, a first terminal of said first potentiometer having applied thereto $V_y$ and the second terminal thereof having applied thereto $-V_y$, a first terminal of said second potentiometer having applied thereto $-V_x$ and the second terminal thereof having applied thereto $-V_x$, the taps of said first and second potentiometers being interconnected so that movement of said tap of said first potentiometer toward said first terminal thereof causes movement of said tap of said second potentiometer toward said first terminal thereof, the output of the tap of said first and second potentiometers being $V_{\beta y}$ and $V_{-\beta x}$ respectively, $V_{\beta y}$ and $V_{-\beta x}$ being utilized by the scanning system to form a portion of said correction voltages.

6. The device of claim 5 further including third and fourth potentiometers, a first terminal of said third potentiometer having applied thereto $V_x$ and the second terminal thereof having applied thereto $-V_x$, a first terminal of said fourth potentiometer having applied thereto $V_y$ and the second terminal thereof having applied thereto $-V_y$, the taps of said third and fourth potentiometers being interconnected so that movement of said tap of said third potentiometer toward said first terminal thereof causes movement of said tap of said fourth potentiometer toward said first terminal thereof, the output of the taps of said third and fourth potentiometers being $V_{\alpha x}$ and $V_{\alpha y}$ respectively being utilized by the scanning system to form a portion of said correction voltages.

7. The device of claim 6 wherein said scanning means further includes a first driver coupled to said first and third potentiometers and to said first coil pair for applying a current to said first coil pair proportional to $(A_1V_x + A_2V_{\alpha x} + A_3V_{\beta y})$, a second driver coupled to said second and fourth potentiometers and to said second coil pair for applying a current to said second coil pair proportional to $(B_1V_y + B_2V_{\alpha y} + B_3V_{-\beta x})$, a third driver coupled to said first and third potentiometers and to said third coil pair for applying a current to said third coil pair proportional to $(C_1V_x + C_2V_{\alpha x} + C_3V_{\beta y})$, and a fourth driver coupled to said second and fourth potentiometers and to said fourth coil pair for applying a current to said fourth coil pair proportional to $(D_1V_y + D_2V_{\alpha y} + D_3V_{-\beta x})$ where the coefficients $A_{1-4}$, $B_{1-4}$, $C_{1-4}$ and $D_{1-4}$ are selected so that the intersection of the beam with the aperture plane is at $(x_o, y_o)$.

* * * * *